US006437555B1

United States Patent
Pioch et al.

(10) Patent No.: US 6,437,555 B1
(45) Date of Patent: Aug. 20, 2002

(54) INDUCTIVE SENSOR FOR MEASURING A CURRENT IN A CONDUCTOR

(75) Inventors: Olivier Pioch, Nice; Imad Smirani, Juan les Pins, both of (FR)

(73) Assignee: Pioch S.A., Carros Cedex 1 (FR)

(*) Notice: Subject to any disclaimer, the term of this patent is extended or adjusted under 35 U.S.C. 154(b) by 9 days.

(21) Appl. No.: 09/657,224

(22) Filed: Sep. 7, 2000

(30) Foreign Application Priority Data

Sep. 9, 1999 (FR) .............................. 99 11306

(51) Int. Cl.[7] .................................................. G01R 1/14
(52) U.S. Cl. .................. 324/127; 324/117 R; 336/172; 336/175; 336/92
(58) Field of Search ............................ 324/117 R, 127, 324/241–243, 258, 207.13–207.15, 205, 301, 219, 263; 336/175, 221, 172

(56) References Cited

U.S. PATENT DOCUMENTS 4,430,615 A * 2/1984 Calvert ....................... 324/239
4,709,205 A * 11/1987 Baurand et al. ............. 324/127

FOREIGN PATENT DOCUMENTS

| EP | 0 652 441 | 5/1995 |
| FR | 2 559 268 | 8/1985 |

* cited by examiner

Primary Examiner—N. Le
Assistant Examiner—Amy He
(74) Attorney, Agent, or Firm—Wenderoth, Lind & Ponack, L.L.P.

(57) ABSTRACT

An inductive sensor for measuring a current in a conductor includes a generally annular winding (10) delimiting a passage for the conductor. The winding extends homogeneously over most of the circumference of a ring except for a section (20) where the winding has a structural discontinuity. The sensor includes at least one identical complementary winding (12). The windings (10, 12) are disposed coaxially and oriented so that the structural discontinuities of the windings are regularly distributed in the angular direction about the common axis of the windings. The windings are connected in series.

18 Claims, 3 Drawing Sheets

INDUCTIVE SENSOR FOR MEASURING A CURRENT IN A CONDUCTOR

BACKGROUND OF THE INVENTION

The present invention relates to an inductive sensor for measuring a current in a conductor, of the kind including a generally annular winding delimiting a passage for the conductor. The winding extends homogeneously over most of the circumference of a ring, except for a section where the winding has a structural discontinuity.

Placing a coil with contiguous turns closed on itself and constituting a wound ring around a conductor to measure the current flowing in it is known in the art. A coil of the above kind is referred to as a Rogowski coil.

When an alternating current flows inside the conductor, a voltage is induced at the terminals of the coil. The voltage is proportional to the time derivative of the current flowing in the conductor. To evaluate that current the terminals of the coil are connected to an integrator circuit known in the art.

A sensor of the above kind is routinely used on the input and/or output busbars of a three-phase transformer.

In installations known in the art one sensor is provided on each of the four busbars of the three-phase supply. Each sensor includes a single winding carried by a non-magnetic support of constant cross section bent on itself to form a ring. The winding has turns regularly distributed about the non-magnetic support. The non-magnetic support has a discontinuity formed by an interruption delimited between its ends which are bent towards each other.

The winding has a similar structural discontinuity in this region of the non-magnetic annular support, where the number of turns is reduced. The region in which the non-magnetic support is interrupted generally has no turns at all. That region corresponds to the ends of the winding, from which depart wires constituting terminals of the winding.

In the region where the sensors are installed, the three-phase power supply busbars are generally disposed side-by-side in a row. Each of the sensors is therefore affected by the current flowing in the adjoining busbars. In particular, because of the presence of a discontinuity in the toroidal structure if the winding, depending on the position of the sensor around a busbar, and in particular its position relative to the adjoining busbars, the voltage at its terminals can vary significantly because of the effect of the adjoining phases flowing in the adjacent busbars.

Thus, as a general rule the asymmetrical nature of the structure of the winding makes the sensor highly sensitive to external magnetic fields; its sensitivity depending in particular on the position of the sensor.

SUMMARY OF THE INVENTION

An object of the invention is to propose an inductive sensor that is relatively insensitive to interfering magnetic fields coming, in particular, from busbars in the immediate vicinity and carrying a current.

To this end, the invention provides an inductive sensor for measuring a current in a conductor, of the aforementioned kind, characterized in that it includes at least one substantially identical complementary winding, which windings are disposed coaxially and oriented so that the structural discontinuities of the windings are regularly distributed in the angular direction about the common axis of the windings, and in that the windings are connected in series.

Particular embodiments of the invention have one or more of the following features:

- it includes two windings disposed symmetrically with respect to their common axis;
- each winding is wound on an annular non-magnetic core;
- each winding includes an even number of layers of superposed contiguous turns extending in the direction of the circumference of the ring, and the turns of the layers of the same pair of layers are wound in opposite directions;
- the windings are received in a protective casing;
- the protective casing delimits an annular chamber receiving the windings, which are encapsulated in a resin therein; and
- each winding has along its periphery two parallel rectilinear sections connected to each other by two semicircular sections.

BRIEF DESCRIPTION OF THE DRAWINGS

The invention will be better understood after reading the following description, which is given by way of example only and with reference to the drawings, in which.

DETAILED DESCRIPTION OF THE PREFERRED EMBODIMENTS

Figure 1:
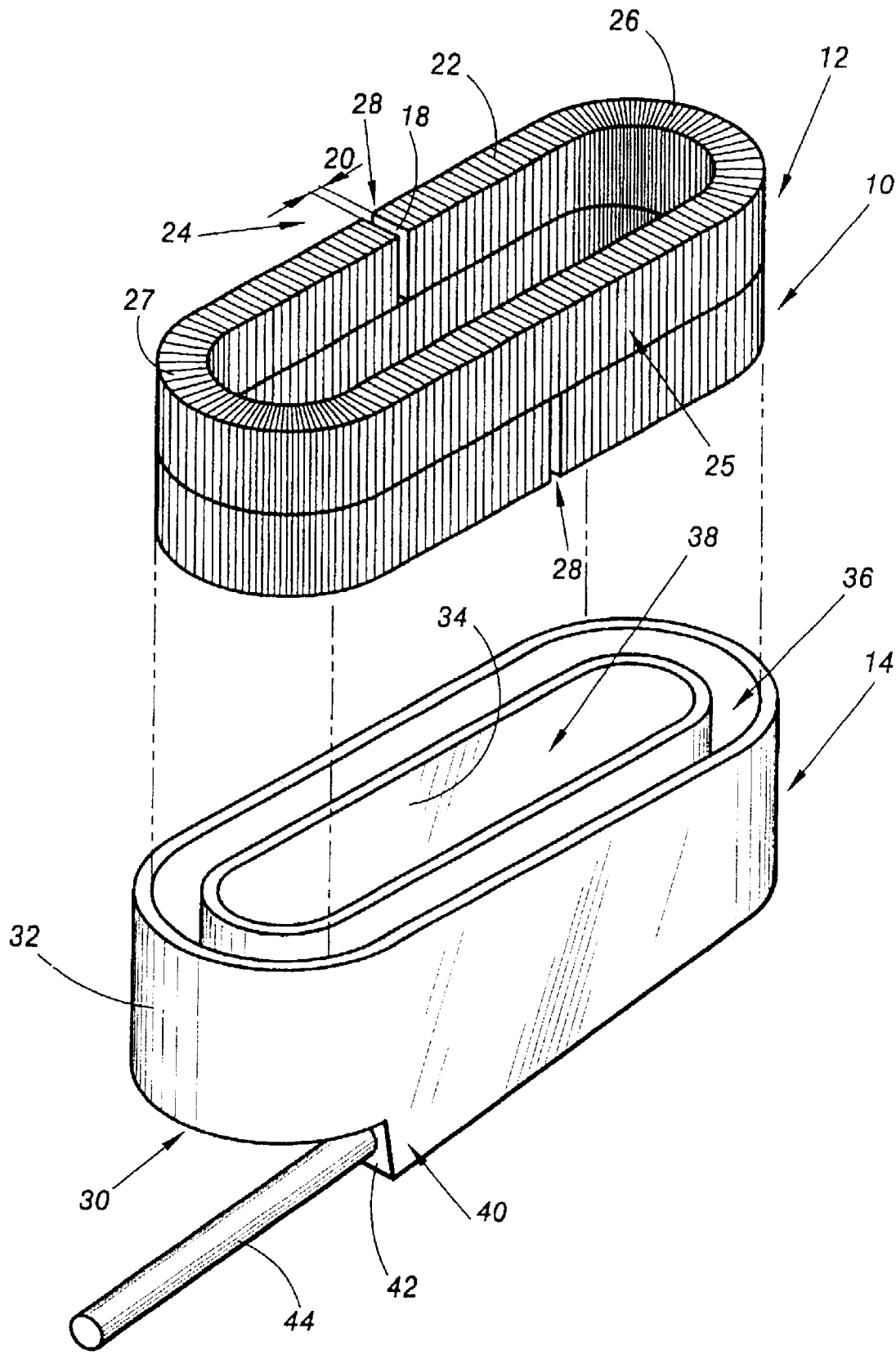
FIG. 1 is an exploded perspective view of an inductive sensor according to the invention.

The sensor according to the invention shown in FIG. 1 essentially includes two identical coils 10, 12 assembled coaxially and head-to-tail within a protective and supportive casing 14. Each coil includes a non-magnetic support or core 18 formed by a bar which is bent on itself to delimit a ring. The facing ends of the core are separated by a gap 20 which is small compared to the size of the coil.

Throughout the description, the term "ring" refers to the volume generated by displacement of a closed contour about an axis according to any generatrix curve. A volume of this kind is sometimes referred to, in error, as a torus.

Contiguous turns constituting a winding 22 are provided over most of the length of the core 18 of each coil. The turns are regularly spaced along the length of the core. Each winding includes 1,065 turns, for example. The wire used for the winding has a diameter of 0.25 mm.

Each winding advantageously includes two layers of turns extending in opposite directions and divided between two superposed thicknesses. The two layers of turns have the same number of turns. The ends of the winding, which are extended by conductive wires, therefore emerge from the winding at the same end of the core.

Figure 2:
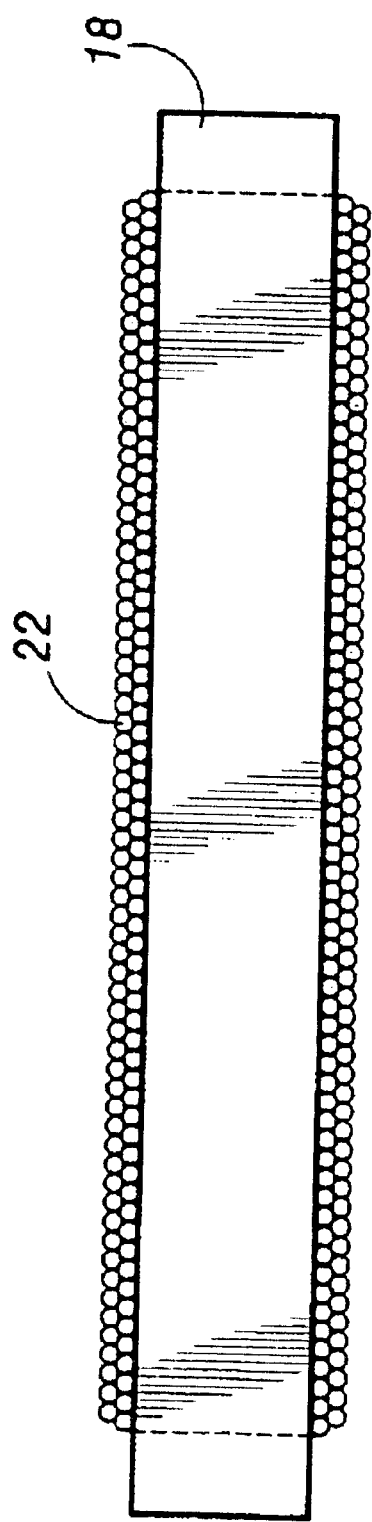
FIG. 2 is an elevational view of a winding used in a toroidal winding of the sensor according to the invention, before it is formed to shape.

FIG. 2 shows the winding 22 on the core 18 before the coil is formed to shape. To reduce the manufacturing cost of each winding, each is formed on a rectilinear bar of non-magnetic material which forms the core 18. The two layers of turns are provided around the bar. The resulting coil is then formed to shape by plastic deformation of the core 18. This plastic deformation consists in bending the two free ends of the core towards each other, thereby imparting an annular shape to the coil, as shown in FIG. 1.

In the example considered here, the ring has two rectilinear and parallel main faces 24, 25 joined by semicylindrical sections 26, 27. The ends of the core 18 face each other substantially in the middle of the face 24 and delimit the gap 20.

After being formed to shape, the winding 22 of each coil has a structural discontinuity 28 in the region of the gap 20. In particular, there are essentially no turns in this region.

According to the invention, the sensor includes two identical coils disposed coaxially one above the other so that the structural discontinuities 28 of the windings are disposed symmetrically with respect to the common axis of the coils, as shown in FIG. 1. The coils are connected in series and placed in an annular housing of the casing 14. The wires connecting the two coils in series are arranged as shown in FIG. 1.

The connecting wires of the two coils are disposed along the coils at their outside peripheries in a joint plane of the two coils place one on the other.

The casing 14 is molded from a plastic material. The casing has an oblong bottom 30 bordered externally by an external skirt 32 that is perpendicular to the bottom. Inside the external skirt 32 is an internal skirt 34 that extends parallel to the external skirt 32. An annular housing 36 for receiving the coils 10 and 12 is defined between the skirts. The height of the skirts 32, 34 is substantially equal to twice the height of a coil 10, 12.

The internal skirt 34 also delimits internally an oblong passage 38 through which a conductive rod passes. The passage generally has a shape corresponding to the cross section of the rod used.

The bottom 30 has a projection 40 forming a ramp extending in the lengthwise direction of the casing. The ramp terminates at a shoulder 42, at which terminates perpendicularly to it a sheath 44 through which the two connecting wires of the coils 10, 12 connected in series are passed.

To assemble the sensor, the two coils 10, 12 are placed inside the annular housing 36. An encapsulating resin such as a polyurethane resin is cast into the housing around the coils. The windings 22 of the coils are therefore embedded in the encapsulating resin, which protects the coils from mechanical and thermal stresses and strengthens the connections of the conductive wires.

The presence in the sensor of two coils, in which the structural discontinuities of the windings are one on each side of the axis of the coils, reduces the influence of the structural discontinuities on the measured signal in the presence of the interfering external fields.

Figure 3:
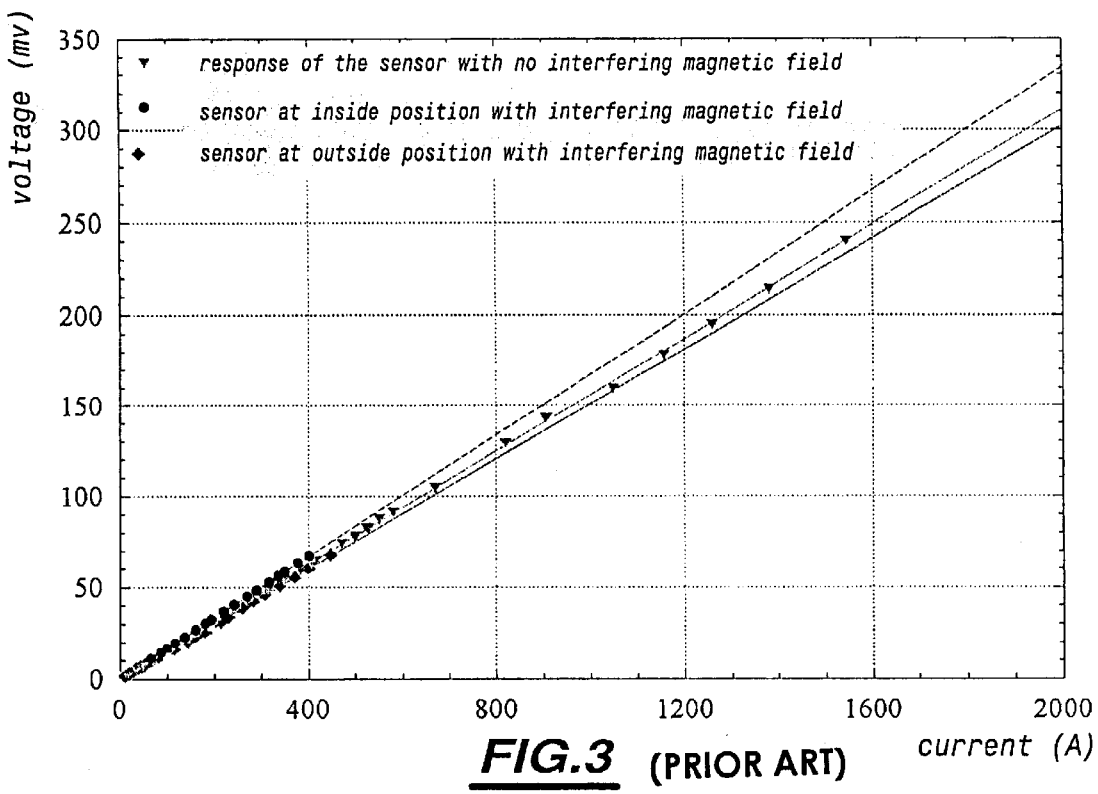
FIGS. 3 and 4 are response curves of a prior art sensor and a sensor according to the invention, respectively, in the presence and in the absence of interfering fields.

FIG. 3 shows the response of a prior art sensor according to its position relative to an interfering magnetic field. The annular sensor consists of a single coil like that shown if FIG. 1. The sensor is therefore identical to the sensor according to the invention except that it includes one coil, not two.

The measurements were made in the absence of an interfering field and in the presence of an interfering field for two different positions of the sensor.

The triangles represent the measurements in the absence of an interfering field.

In the presence of an interfering filed, in a first position, the structural discontinuity of the sensor was oriented towards the conductor inducing the interfering magnetic field. The measurement results are represented by circles. The squares represent the measurements in the other position, in which the structural discontinuity was opposite the conductor causing the interfering magnetic field.

FIG. 3 shows that the responses of the sensor for the various currents measured are carried by straight lines whose director coefficient corresponds to the sensitivity of the sensor. As the intensities increase, the straight lines tend to diverge with a substantial offset due to the presence of the interfering field.

Figure 4:
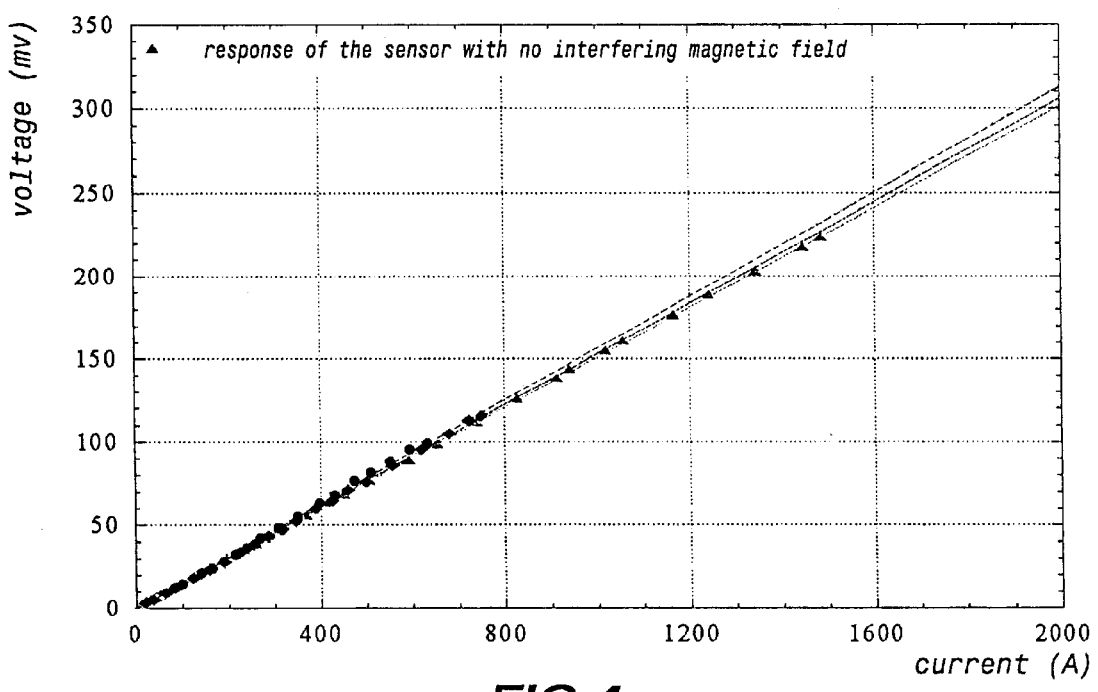

FIG. 4 shows the response of a sensor of the kind shown in FIG. 1 under the same experimental conditions. The same symbols are used. This figure shows that the respective straight lines representing the sensitivity of the sensor in the absence of a magnetic field and in the presence of a magnetic field are very close together, which shows the reduced sensitivity of the sensor to ambient electromagnetic interference.

In the embodiment shown in FIG. 1, the sensor includes two coils connected in series. As an alternative to this, however, the sensor can include more than two coils, and in particular four coils disposed coaxially, with each coil having a structural discontinuity. The structural discontinuities are then regularly distributed in an angular direction about the axis of the windings. The angular offsets measured from the axis of the coaxial windings between the structural discontinuities are therefore equal.

What is claimed is:

1. An inductive sensor for measuring a current in a conductor, comprising:

a first generally ring-shaped winding having opposite open ends and a first axis passing through said opposite open ends, and also having a first peripherally extending structural discontinuity, wherein said first generally ring-shaped winding delimits a first passage for receiving a conductor; and a second generally ring-shaped winding having opposite open ends and a second axis passing through said opposite open ends, and also having a second peripherally extending structural discontinuity, wherein said second generally ring-shaped winding delimits a second passage for receiving a conductor, wherein said first generally ring-shaped winding and said second generally ring-shaped winding are coaxially arranged relative to one another such that said first axis and said second axis are coincident and define a common axis, and also such that said first peripherally extending structural discontinuity and said second peripherally extending structural discontinuity are regularly positioned about said common axis, and wherein said first generally ring-shaped winding and said second generally ring-shaped winding are connected in series.

2. The inductive sensor according to claim 1, wherein said first generally ring-shaped winding and said second generally ring-shaped winding are symmetrically disposed with respect to said common axis.

3. The inductive sensor according to claim 2, further comprising a first generally annular non-magnetic core and a second generally annular non-magnetic core, wherein said first generally ring-shaped winding is on said first generally annular non-magnetic core and said second generally ring-shaped winding is on said second generally annular non-magnetic core.

4. The inductive sensor according to claim 3, wherein each of said first generally ring-shaped winding and said second generally ring-shaped winding comprises peripherally extending superposed contiguous turns such that an even number of layers of turns are provided, with the turns of immediately adjacent layers extending in opposite peripheral directions.

5. The inductive sensor according to claim 4, further comprising a protective casing in which are located said first generally ring-shaped winding and said second generally ring-shaped winding.

6. The inductive sensor according to claim 5, wherein said protective casing defines an annular chamber in which are located said first generally ring-shaped winding and said second generally ring-shaped winding, and further comprising a resin encapsulating said first generally ring-shaped winding and said second generally ring-shaped winding within said annular chamber.

7. The inductive sensor according to claim 6, wherein each of said first generally ring-shaped winding and said second generally ring-shaped winding includes a periphery defined by two parallel rectilinear sections interconnected by two semicircular sections.

8. The inductive sensor according to claim 1, further comprising a first generally annular non-magnetic core and a second generally annular non-magnetic core, wherein said first generally ring-shaped winding is on said first generally annular non-magnetic core and said second generally ring-shaped winding is on said second generally annular non-magnetic core.

9. The inductive sensor according to claim 1, wherein each of said first generally ring-shaped winding and said second generally ring-shaped winding comprises peripherally extending superposed contiguous turns such that an even number of layers of turns are provided, with the turns of immediately adjacent layers extending in opposite peripheral directions.

10. The inductive sensor according to claim 1, further comprising a protective casing in which are located said first generally ring-shaped winding and said second generally ring-shaped winding.

11. The inductive sensor according to claim 10, wherein said protective casing defines an annular chamber in which are located said first generally ring-shaped winding and said second generally ring-shaped winding, and further comprising a resin encapsulating said first generally ring-shaped winding and said second generally ring-shaped winding within said annular chamber.

12. The inductive sensor according to claim 1, wherein each of said first generally ring-shaped winding and said second generally ring-shaped winding includes a periphery defined by two parallel rectilinear sections interconnected by two semicircular sections.

13. The inductive sensor according to claim 1, wherein each of said first generally ring-shaped winding and said second generally ring-shaped winding comprises peripherally extending superposed contiguous turns such that an even number of layers of turns are provided.

14. The inductive sensor according to claim 13, wherein said first generally ring-shaped winding and said second generally ring-shaped winding are symmetrically disposed with respect to said common axis.

15. The inductive sensor according to claim 13, further comprising a first generally annular non-magnetic core and a second generally annular non-magnetic core, wherein said first generally ring-shaped winding is on said first generally annular non-magnetic core and said second generally ring-shaped winding is on said second generally annular non-magnetic core.

16. The inductive sensor according to claim 13, further comprising a protective casing in which are located said first generally ring-shaped winding and said second generally ring-shaped winding.

17. The inductive sensor according to claim 16, wherein said protective casing defines an annular chamber in which are located said first generally ring-shaped winding and said second generally ring-shaped winding, and further comprising a resin encapsulating said first generally ring-shaped winding and said second generally ring-shaped winding within said annular chamber.

18. The inductive sensor according to claim 13, wherein each of said first generally ring-shaped winding and said second generally ring-shaped winding includes a periphery defined by two parallel rectilinear sections interconnected by two semicircular sections.

* * * * *